(12) United States Patent
Musselman

(10) Patent No.: US 7,437,282 B2
(45) Date of Patent: Oct. 14, 2008

(54) METHOD AND APPARATUS TO PROVIDE ALTERNATIVE STIMULUS TO SIGNALS INTERNAL TO A MODEL ACTIVELY RUNNING ON A LOGIC SIMULATION HARDWARE EMULATOR

(75) Inventor: Roy Glenn Musselman, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 380 days.

(21) Appl. No.: 11/232,765

(22) Filed: Sep. 22, 2005

(65) Prior Publication Data
US 2007/0067150 A1    Mar. 22, 2007

(51) Int. Cl.
G06F 9/455 (2006.01)
G06F 9/445 (2006.01)
G06F 11/30 (2006.01)

(52) U.S. Cl. .......................... 703/24; 703/27; 714/738; 710/29

(58) Field of Classification Search .................. 703/24, 703/25, 27; 714/738; 716/5; 710/29
See application file for complete search history.

(56) References Cited

U.S. PATENT DOCUMENTS

| 4,455,654 | A | * | 6/1984 | Bhaskar et al. | 714/28 |
| 4,939,507 | A | * | 7/1990 | Beard et al. | 345/156 |
| 5,206,935 | A | * | 4/1993 | Sinks et al. | 710/29 |
| 6,195,776 | B1 | * | 2/2001 | Ruiz et al. | 714/738 |
| 6,499,131 | B1 | * | 12/2002 | Savithri et al. | 716/5 |
| 2004/0215442 | A1 | * | 10/2004 | Musselman | 703/24 |
| 2005/0114113 | A1 | * | 5/2005 | Quayle et al. | 703/25 |

* cited by examiner

*Primary Examiner*—Thai Phan
(74) *Attorney, Agent, or Firm*—James R. Nock

(57) ABSTRACT

The present invention enhances the Direct Access Stimulus (DAS) interface presently employed within a logic simulation hardware emulator to provide alternative stimulus to signals internal to a model actively running on a logic simulation hardware emulator. The present invention accomplishes this by introducing a set of special logic within the logic model to provide an alternate source for selected signals, identifies the special logic so that it is subsequently connected directly to the DAS card interface, and adds information to a symbol table so that this special logic can be identified as signal accessible through the DAS card interface. At runtime, when the user control program accesses facilities that have been connected to the DAS card interface, a set of special routines automatically reference the symbol table information to access the special logic that is connected to the DAS card interface.

20 Claims, 7 Drawing Sheets

METHOD AND APPARATUS TO PROVIDE ALTERNATIVE STIMULUS TO SIGNALS INTERNAL TO A MODEL ACTIVELY RUNNING ON A LOGIC SIMULATION HARDWARE EMULATOR

FIELD OF THE INVENTION

The present invention relates generally to logic simulation hardware emulation, and more specifically to providing alternative stimulus to signals internal to a model actively running on a logic simulation hardware emulator.

BACKGROUND OF THE INVENTION

Design verification is essential to virtually any very large scale integration (VLSI) design project. One of the popular verification methods is logic simulation. Logic simulation software reports on how a circuit under design responds to a sequence of input vectors, so the designer can judge whether the circuit behaves as expected over an input sequence. The more vectors simulated, the greater confidence the designer has in the correctness of the designing circuit.

As circuit complexity increases and the time to market shortens, inadequate simulation speed becomes a major bottleneck in the design process. As a result, several special purpose machines have been built to simulate/emulate complex logic designs in hardware, rather than software. Such emulation/acceleration devices can provide several orders of magnitude of speed improvement during the simulation/emulation process. Thus, the necessity and usefulness of such devices has increased enormously with growth in the complexity of integrated circuits.

An emulation/acceleration engine operates to mimic the logical design of a set of one or more integrated circuit chips. The emulation of these chips in terms of their logical design is highly desirable for several reasons which are discussed in more detail below. It is, however, noted that the utilization of emulation/acceleration engines has also grown up with and around the corresponding utilization of design automation tools for the construction and design of integrated circuit chip devices. In particular, as part of the input for the design automation process, logic descriptions of the desired circuit chip functions are provided. The existence of such software tools for processing these descriptions in the design process is well mated to the utilization of emulation/acceleration engines which are electrically configured to duplicate the same logic function that is provided in a design automation tool.

Utilization of emulation/acceleration devices permits testing and verification, via actual electrical circuits, of logical designs before these designs are committed to a so-called "silicon foundry" for manufacture. The input to such foundries is the functional logic description required for the chip, and a set of photolithographic masks which are then used in the manufacture of the desired electrical circuit chip devices. The output of the foundry is a set of chips that are a physical manifestation of the logic description and masks provided to the foundry. However, it is noted that the construction of such masks and the initial production of circuit chips is expensive. Any passage of a given device having the prescribed logic functionality though such a foundry is an expensive and time consuming process which clearly should be undertaken only once. It is the purpose of emulation/acceleration engines to ensure such a single passage from the functional logic design stage through the stage of chip production via such a foundry.

Verifying that logic designs are correct before committing a design to manufacturing, therefore, eliminates the need for costly and time-consuming multiple passes through a silicon foundry. Debugging logic errors deep inside a logic chip can be extremely difficult because of very limited observability. Emulation provides two very significant advantages. Firstly, the proper verification of a functional logic design eliminates the need for a second costly passage through the foundry, and, secondly, and just as importantly, getting the design "right the first time" means that the design does not have to be debugged using foundry produced parts having design errors. Accordingly, production delays are significantly reduced and the time to market for the particular technology/technology improvements embedded in the integrated circuit chip is greatly reduced, thus positively impacting the ability to deliver the most sophisticated technological solutions to consumers in as short of time as possible.

An additional advantage that emulation/acceleration systems have is that they act as a functioning system of electrical circuits which makes possible the early validation of software which is meant to operate the system that the emulator/accelerator is mimicking. Thus, software can be designed, evaluated and tested well before the time when the system is embodied in actual circuit chips. Additionally, emulation/acceleration systems can also operate as simulator-accelerator devices thus providing a high speed simulation platform.

FIG. 1A illustrates a high-level block diagram of a typical emulation/acceleration system 10 (hereinafter referred to as emulation system 10), which is controlled by a host workstation 12. Emulation system 10 includes at least one emulation board 14, which, in turn, contains a plurality of emulation modules 16, as shown in FIG. 1B. Each emulation module 16 contains a plurality of emulation processors 18, as shown in FIG. 1C. Each emulation processor 18 is programmed to evaluate a particular logic function (for example, AND, OR, XOR, NOT, NOR, NAND, etc.). The programmed emulation processors 18, together as a connected unit, emulate an entire desired logic design under test 11 (i.e., the programmed emulation processors form part of a simulation "model" 15 for the logic design).

The overall simulation throughput of such a system is controlled (and limited) by the interface between the simulation logic model 15 running on the emulation system 10 and a runtime control program 20 running on a host workstation 12. Transactions between the runtime control program 20 and the simulation logic model 15 include reading and writing the values of logic facilities contained within the model and the execution of cycles to recalculate the model state. The default mechanism for these access transactions is through the emulator service interface which consists of a network connection 13 between the host workstation 12 and custom control cards 27 resident within the emulation system 10. The control cards 27 then interface with the emulation logic boards through a maintenance interface 31. The maintenance interface 31 has access to all logic and memory elements within the emulation board 14. Although the maintenance interface 31 has a relatively low latency, the latency of the network connection 13 is rather high (e.g., 1-2 milliseconds). Multiplied by several hundreds of thousands of operations, that 1-2 millisecond latency greatly impacts the overall simulation performance.

Further, if the emulator is cycling, the maintenance interface 31 has a further restriction in that accesses can only be performed within a narrow timing window, such that only a handful of accesses per cycle is possible. This significantly reduces the memory access bandwidth available via the maintenance interface 31.

An alternate communication path (i.e., a Direct Access Stimulus (DAS) card interface) may also be provided between the runtime control program 20 and the simulation logic model 15 that bypasses the network connection 13 and control subsystem. This path comprises a custom DAS card 33 plugged into a PCI slot 34 in the host workstation 12. A special high-speed multi-strand DAS cable 35 is connected between the DAS card 33 and the emulation board(s) 14 that contain the simulation logic model 15.

This DAS card interface is much more efficient than the network interface 13 because of the more direct connection to logic facilities. To use the DAS card interface most efficiently, a single "cycle forever" command is issued from the control program 20 to the emulation system 10 through the network interface 13. The emulation system 10 will then continuously evaluate the model state at the maximum raw cycle speed determined during the compilation of the model. This mode of operation is usually required when the emulator is physically connected to an external target system 36 that requires uninterrupted operation on the interface to the emulator. Read and write accesses from the control program 20 through the DAS card interface will then directly access the model facilities as they are being evaluated. These accesses will not incur the long latencies associated with the commands sent through the network interface 13.

Unlike the universal access to all model facilities permitted by the network interface and maintenance interface, the DAS Card interface is limited to accessing only primary inputs and primary outputs of the logic model 15. Internal model facilities that are not exposed cannot be accessed. Given enough routing resources within the emulator, any internal signal can be tapped onto and routed to the DAS card interface as if it were a logic model 15 primary output. Thus, the value for any internal signal can be directly read by the control program 20. However, it is not possible for the control program 20 to alter a value of the internal signal.

The emulator system architecture is designed such that internal signals within a logic model 15 can have only a single source. Synthesis programs which run at model compile time resolve cases with multiple sourced signals and modify the logic structure to insure that each signal has only one source. Thus an internal model signal already has a single source from a logic function within the model and thus cannot also be routed to an input from the DAS card interface.

There is a need for a mechanism to utilize the DAS card interface of an emulation system in an innovative fashion to enable the efficient alteration of internal model logic facilities while the emulator is actively cycling. Such a solution should overcome the emulator system architecture requirement that individual model signals can have only a single source and should enable the individual model signals to be directly accessible from the DAS card interface.

SUMMARY OF THE INVENTION

The present invention provides a method, apparatus and computer program product to provide alternative stimulus to signals internal to a logic model actively running on a logic simulation hardware emulator. The present invention accomplishes this by introducing a set of special logic within the logic model to provide an alternate source for selected signals, labels this special logic so that it is subsequently connected directly to the Direct Access Stimulus (DAS) card interface, and adds information to a symbol table so that this special logic can be identified as signal accessible through the DAS card interface. At runtime, when the user control program accesses facilities that have been connected to the DAS card interface, a set of special routines automatically reference the symbol table information to access the special logic that is connected to the DAS card interface.

More specifically, the present invention describes a method for providing alternative stimulus to signals internal to a logic simulation model residing on a logic simulation hardware emulator. The method begins by creating a set of special logic in the logic simulation model during the model compile process to enable access to signals internal to the logic simulation model via a DAS card interface. Next, the method enables a control program to access and alter the signals internal to the logic simulation model at runtime.

The step of creating a set of special logic in the logic simulation model during the model compile process further includes the steps of: 1) inserting the set of special logic into model logic structures within the logic simulation model to provide alternate source and control signals associated with a selected internal signal/group of signals; 2) creating an entry within a symbol table for the selected internal signal/group of signals, the entry having attributes indicating that the selected internal signal/group of signals is accessible via the DAS card interface; and 3) creating attributes within the entry for the selected internal signal/group of signals which contain pointers to the location of the alternate source and control signals associated with the selected internal signal/group of signals.

The step of enabling a control program to access and alter the signal/group of signals internal to the logic simulation model at runtime further includes the steps of: 1) providing a feature to allow the control program to enable or disable access to signals via the DAS interface; 2) if access to the DAS interface is enabled, examining the attributes within the symbol table entry of the selected internal signal to determine if the selected internal signal is accessible via the DAS interface; and 3) if the selected internal signal is accessible via the DAS interface, determining the location pointer attributes for the associated alternate source and control signals to enable the control program to access the selected internal signal via the associated alternate source and control signals.

The present invention further provides a logic simulation hardware emulator, including a host workstation having a control program. The emulator further includes an emulation system having a logic model, the logic model having a plurality of signals. The emulator further includes a set of special logic coupled to the logic model for providing alternate sources to a set of selected signals chosen from the plurality of signals. Finally, the emulator includes a DAS interface coupling the control program to the set of special logic. The control program provides alternative stimulus to one or more signals internal to the logic model while the emulation system is actively cycling via the set of special logic. This special logic is inserted at logic model compile time. In one embodiment, the special logic includes a multiplexer for multiplexing the current state of the internal signal with an alternative source for the signal (e.g., via a "stick" or "put" operation).

DETAILED DESCRIPTION OF THE PREFERRED EMBODIMENTS

Glossary of Terms selected signals—signals within the logic model that have been selected to be accessible via the DAS/SA interface.

set of special logic—logic dynamically added to the logic model to provide alternate sources for the selected signals.

alternate source and control signals—part of the set of special logic that is associated with each of the selected signals and are connected to the DAS/SA interface.

symbol table—a software structure containing information on each internal signal /group of signals in the logic model.

symbol table entry—a specific part of the symbol table that corresponds to a specific internal signal/group of signals.

attributes—attributes fields within a symbol table entry containing information about specific characteristics associated with each internal signal/group of signals.

location pointers—symbol table entry attributes that point to the location of signals on the DAS/SA interface. The values for these are created during the model build process and are referenced during the run-time process.

Overview

The present invention enhances the Direct Access Stimulus (DAS) card interface presently employed within a logic simulation hardware emulator to provide access to a set of selected signals present within a logic model while the emulator is actively cycling.

Figure 1A:
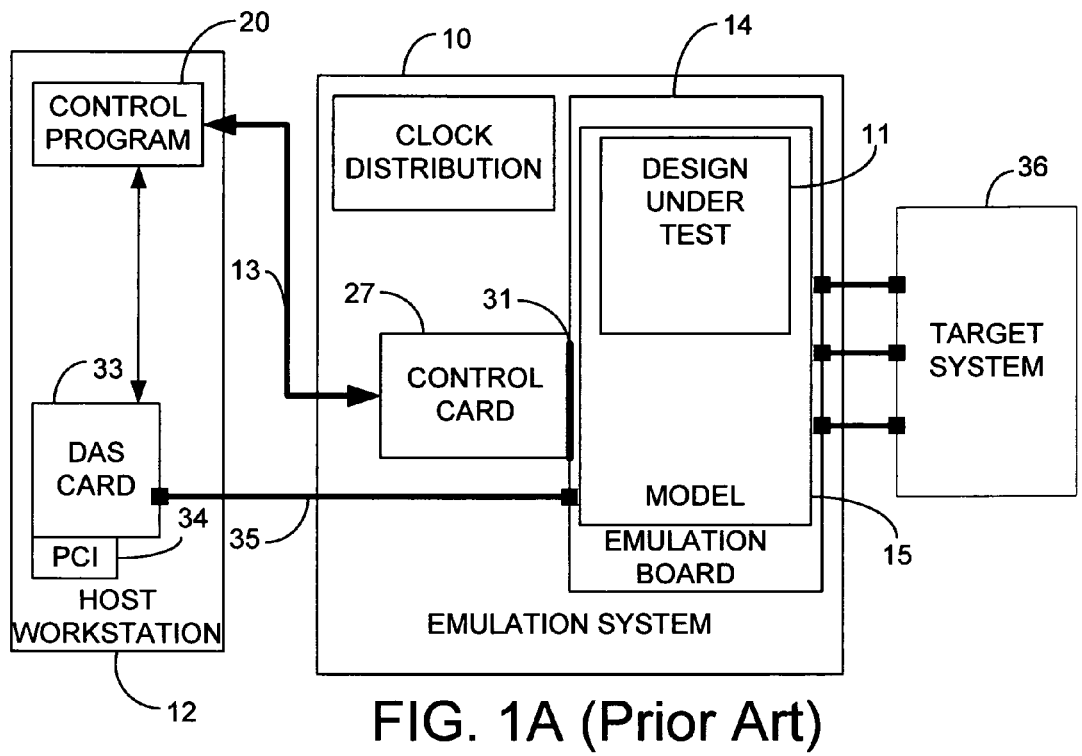
FIG. 1A (Prior Art) is a high-level block diagram of a typical logic emulation system controlled by a host workstation.
Figure 1B:
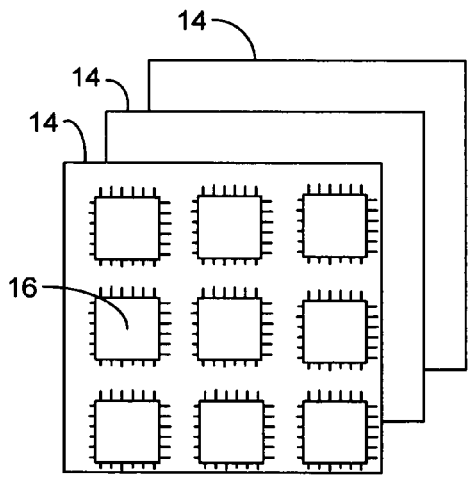
FIG. 1B (Prior Art) is a representation of an emulation board from the system of FIG. 1A where the board contains a plurality of emulation modules.
Figure 1C:
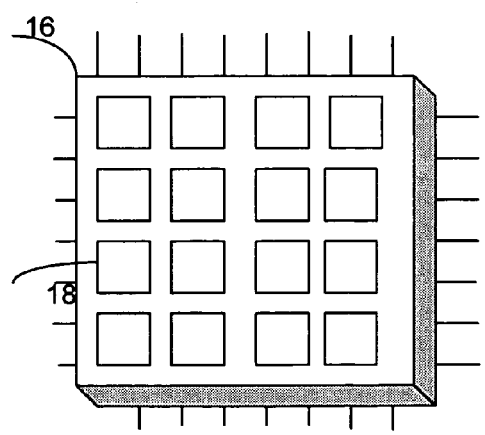
FIG. 1C (Prior Art) is a close-up view of an emulation module, previously shown in FIG. 1B, wherein the module contains a plurality of emulation processors.
Figure 2:
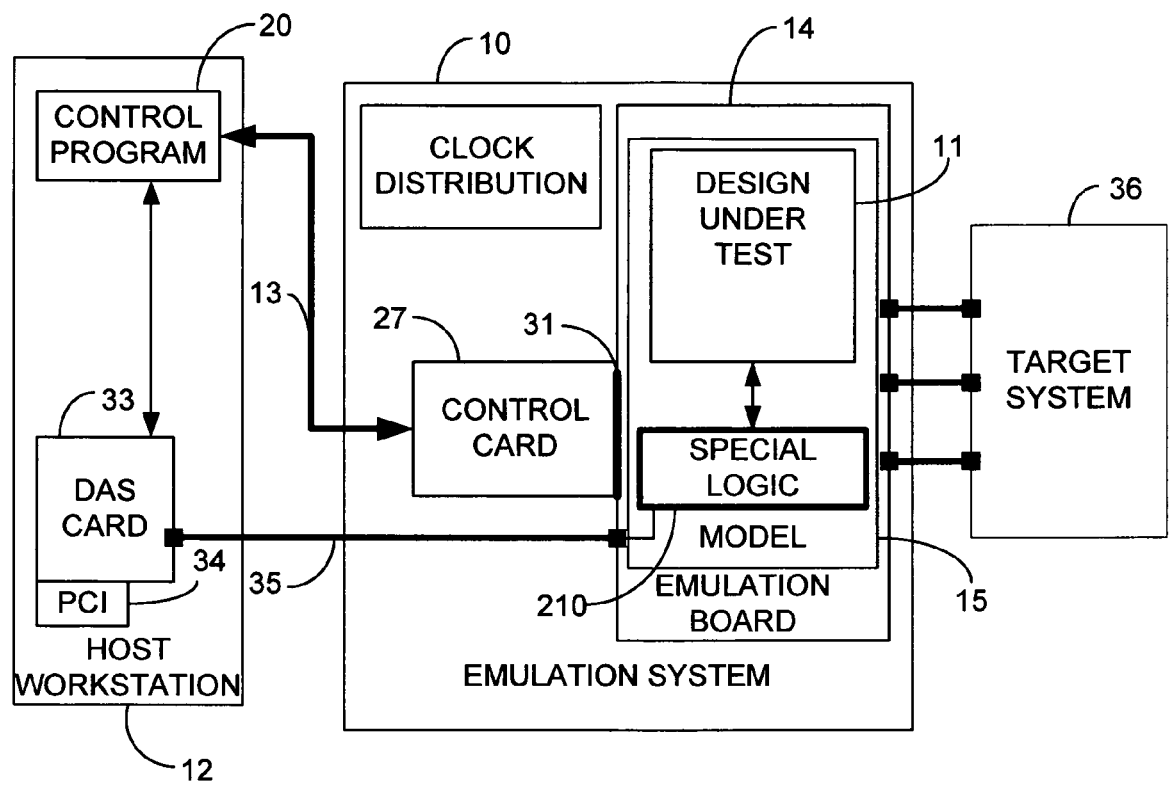
FIG. 2 is a high-level block diagram of the logic emulation system of the present invention, illustrating the inclusion of a set special logic at logic model compile time to provide alternate sources for the selected signals.

The present invention comprises two software functions. The first software function is executed during the model build process (i.e., at compile time). It dynamically creates a set of special logic (FIG. 2, element 210) within the logic model that provides alternate sources and controls for selected signals within the models. This first software function also adds new alternate source and control signals to the list of signals that are connected to the DAS card interface. Finally, the first software function annotates the symbol table entries with attributes indicating that the selected signals are accessible via the DAS card interface and also creates attributes that contain pointers to the location of the associated alternate source and control signals on the DAS card interface, thus enabling user control software to access the selected signals subsequently at runtime.

The second software function comprises routines that are executed at runtime. This function provides a feature to allow user software to enable or disable access to signals via the DAS card interface. When the DAS card interface is enabled, special functions are automatically called when the user program accesses each signal. These functions examine the attributes in the symbol table entry for the selected signal to determine if the selected signal is accessible via the DAS card interface. If the symbol table attributes indicate that the selected signal is indeed accessible via the DAS card interface, other special functions use the location pointer attributes for the associated alternate source and control signals to manipulate these alternate source and control signals on the DAS card interface in a way to effectively perform the access to the selected signal.

The present invention offers several advantages: 1) access through the DAS card interface is much faster than utilizing the conventional network/maintenance interface; 2) the user control program is unaware that the facility being accessed is actually being accessed through the DAS card interface; 3) no user code changes are necessary to utilize this feature; 4) both "temporary alter" (i.e., "put") or continuously force (i.e., "stick") operations are supported; and 5) both combinational and latched facilities are accessible.

As a result, the performance of the present invention is limited by the evaluation speed of the emulator, the throughput of the DAS card interface, and the performance of the host workstation, but not by the network/maintenance interface.

Figure 3A:
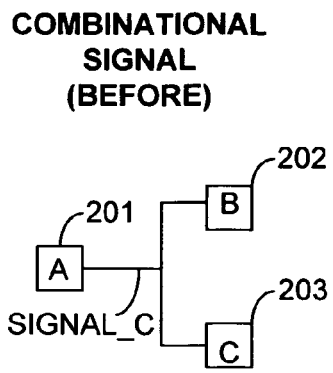
FIGS. 3A and 3B illustrate a combinational signal internal to the model logic before (FIG. 3A) and after (FIG. 3B) the insertion of special logic to provide an alternate source for the signal.
Figure 3B:
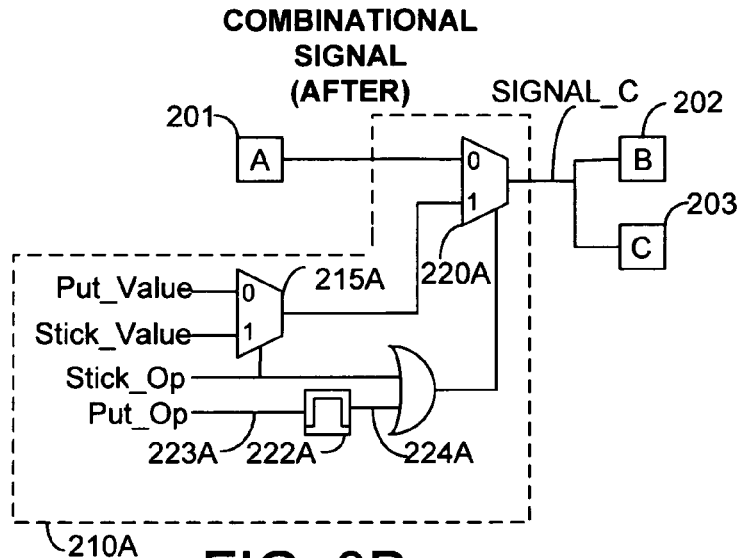
Figure 4A:
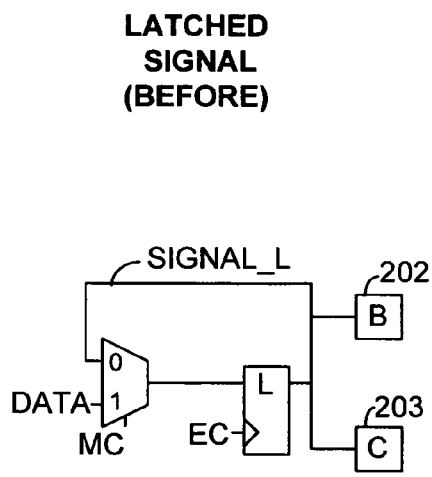
FIGS. 4A and 4B illustrate a latched signal internal to the model logic before (FIG. 4A) and after (FIG. 4B) the insertion of special logic to provide an alternate source for the signal.
Figure 4B:
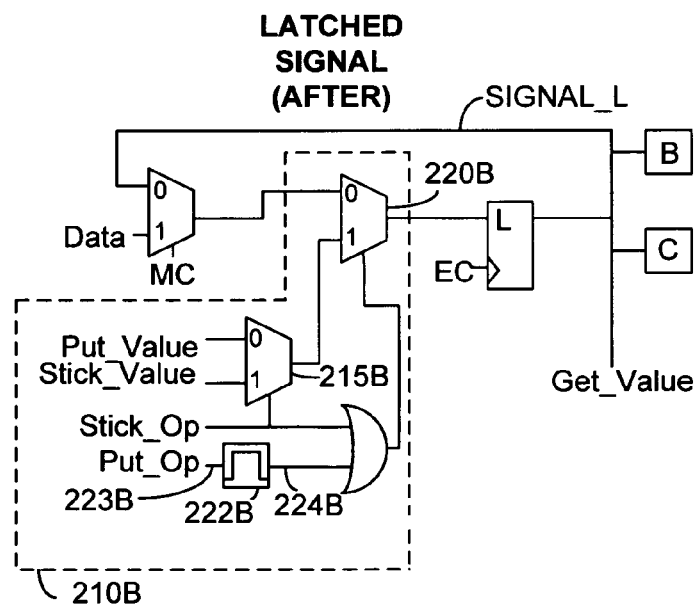

Description of an Exemplary Embodiment—Creating Special Logic with the Logic Model at CompileTime Turning now to the Drawings, wherein like numbers denote like parts throughout the several views, FIGS. 3A and 3B illustrate how special logic 210A (shown within dashed lines) is inserted into the model logic structure where a designated signal (e.g., SIGNAL_C) is sourced by a combinational logic primitive function (e.g., element "A"). Similarly, FIGS. 4A and 4B illustrate how special logic 210B (shown within dashed lines) is inserted into the model logic structure where the designated signal (e.g., SIGNAL_L), is sourced by a latch function (e.g., a latch element "L"). Elements "A", "B" and "C", in FIGS. 3A, 3B, 4A and 4B are any type of combinational logic primitive function.

Latch "L" is clocked by an emulator clock "EC" signal. The EC signal is an implicit signal that is active (i.e. logical 1) when the logic simulation hardware emulator is actually cycling. Latches (e.g., Latch "L") that are controlled by this implicit signal are evaluated every emulation cycle. When the logic simulation hardware emulator is stopped, thus allowing operations on the maintenance interface via the network connection, the "EC" signal is effectively inactive, thus freezing the state of all the latches.

The signal labeled "MC" (model clock) is an actual signal in the logic model that controls the evaluation of a group of latches (e.g., Latch "L"). When signal "MC" is inactive (i.e. logical 0), latch "L" will assume its previous value since the multiplexer gate will propagate the latch output back to the latch input. When MC is active, (i.e. logical 1) latch "L" will assume the value of Data signal. There may be many MC signals in the logic model, the source of each is determined by the user's oscillator and clock distribution design.

The special logic 210A, 210B is the same whether used for a combinational signal (as shown in FIG. 3B) or a latched signal (as shown in FIG. 4B), but the point of insertion is slightly different (as illustrated in FIGS. 3B and 4B). The special logic 210A, 210B intercepts the designated signal with a selector function (e.g., a multiplexer) 220A, 220B which provides an alternate source for the signal (via input "1"). This alternate source can be either the "Put_Value" or "Stick_Value" signals and is selectable based on the values of the "Put_Op" or "Stick_Op" signals. Within the context of the present invention, a "stick" operation implements a continuous force operation (i.e., the continuous "stick" value remains in force until altered) and a "put" operation implements a temporary 1-cycle alter operation.

If the "Stick_Op" signal is on (i.e., has a logic value of 1), then the "Stick_Value" signal propagates to the output of multiplexer 215A, 215B, and thus to the output of 220A and 220B. If the "Stick_Op" signal is off (i.e., has a logic value of 0), then the "Put_Value" signal propagates to the output of multiplexer 215A, 215B and thus to the output of 220A and 220B only when the "Put_Op" signal toggles (i.e., switches from 1 to 0 or 0 to 1).

Figure 5:
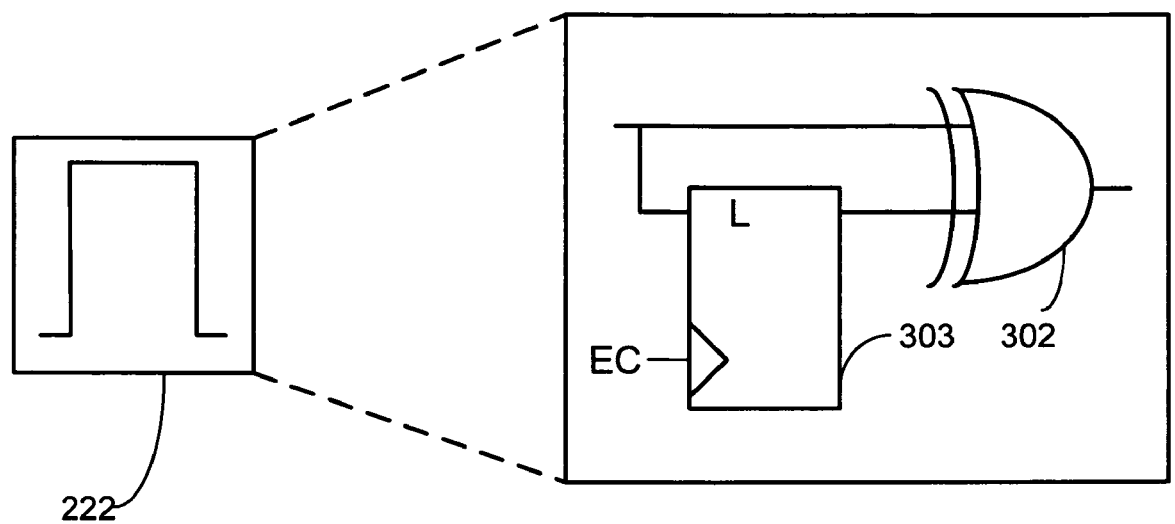
FIG. 5 illustrates the detail of an edge detector circuit previously illustrated in FIGS. 3B and 4B.

FIG. 5 illustrates the detail of an edge detector circuit 222 (previously illustrated in FIGS. 3B and 4B, as 222A and 222B, respectively) used to detect a change in the "Put_Op" signal. The "Put_Op" signal is routed to an input of a latch 303 and also to a first input of an exclusive OR 302. The output of latch 303 is routed to a second input of exclusive OR 302. An emulator clock "EC" is used to control latch 303. Now, referring back to FIGS. 3B and 4B, the output signal 224A, 224B from the edge detector circuit 222A, 222B is a one cycle pulse coincident with the changing edge of the input signal 223A, 223B.

Figure 8:
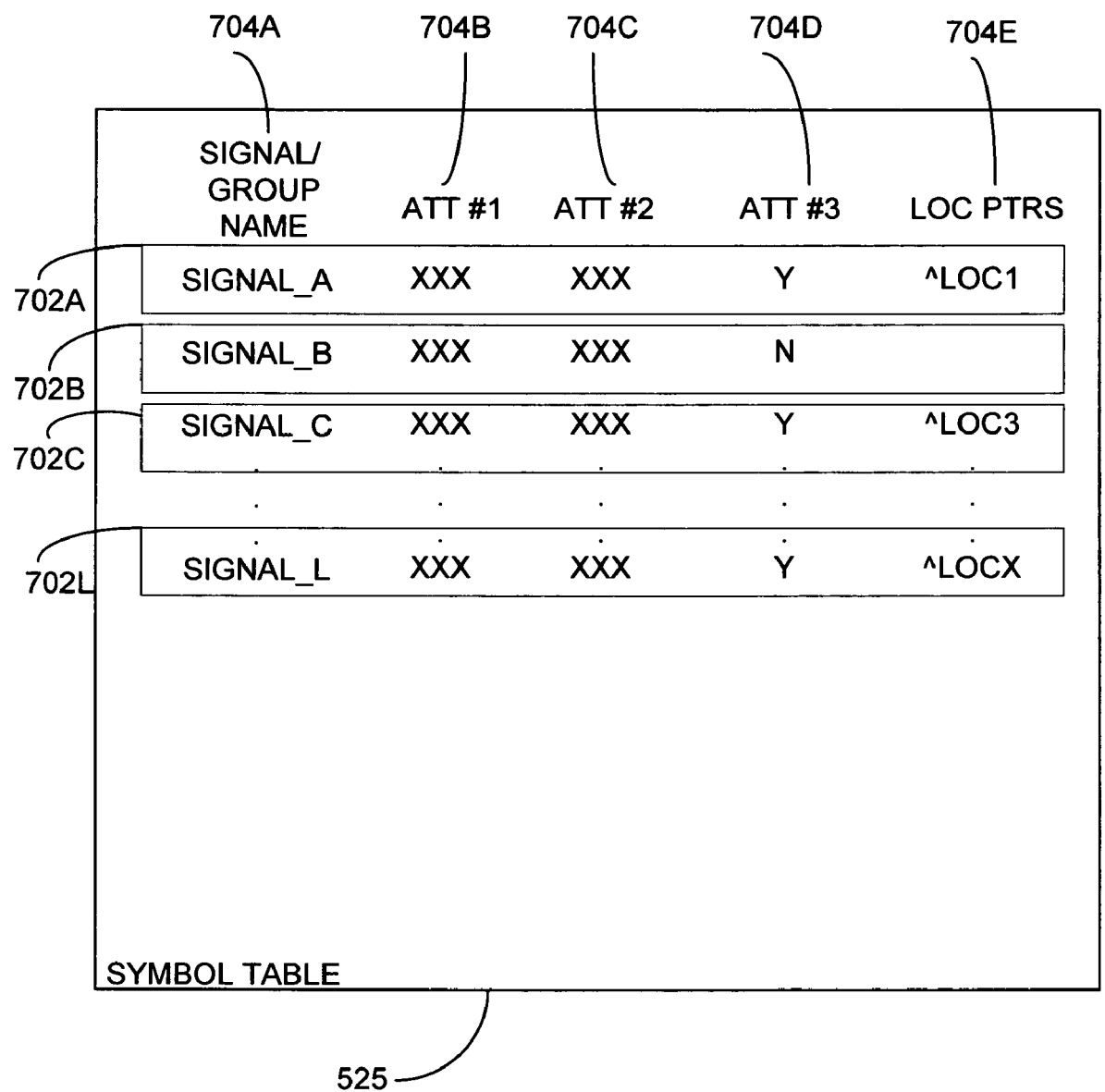
FIG. 8 illustrates a symbol table in accordance with the present invention.

Referring back to FIGS. 3B and 4B, the four new signals: "Put_Value", "Stick_Value", "Put_Op" and "Stick_Op", associated with each designated signal (e.g., SIGNAL_C, SIGNAL_L) are connected to the DAS card interface in the standard fashion and this group of signals is recorded in a symbol table (FIG. 8, element 525) as a symbol table entry. Each symbol table entry includes attributes which are fields which describe information about specific characteristics associated with each signal/group of signals. The attribute include location pointers 704E that point to the location of signals on the DAS card interface, which are later referenced during the runtime process. FIG. 8, described in more detail subsequently, illustrates a symbol table in accordance with the present invention. The use of an additional "Get_Value" signal shows that any signal can be directly connected to the DAS card interface without the need for any additional special logic.

Description of an Exemplary Embodiment—Accessing Selected Signals at Runtime At runtime, the control program 20 provides a feature to allow a user to enable or disable access to signals via the DAS card interface. When the DAS card interface feature is enabled, special functions are automatically called when the user accesses each signal via the control program 20. These functions examine the attributes in the symbol table entry for the selected signal to determine if the selected signal is accessible via the DAS card interface. If so, other special functions use the location pointer attributes for the associated alternate source and control signals to manipulate these signals in such a way as to access the selected signal. When the DAS card interface is enabled, all of the logic within the logic model 15 is continuously being evaluated. The emulator clock "EC" is active. The runtime software dynamically changes the values on the DAS card interface as needed to perform the operations from the control program 20.

To perform a "stick" operation, a specific desired logic value is placed on the "Stick_Value" signal and the "Stick_Op" signal will be set to 1. To release the stick (i.e., "Unstick"), the "Stick_Op" signal is set to 0.

To perform a "put" operation, the desired logic value is placed on the "Put_Value" signal and the value currently on the "Put_Op" signal is inverted from its current state (i.e., toggled). Once again, the "stick" implements a continuous force operation and the "put" implements a temporary 1-cycle alter operation. In one embodiment of the present invention, the stick operation has precedence over the put operation.

If the DAS card feature is not enabled, SIGNAL_C and SIGNAL_L are directly accessible through the network/maintenance interface. Special care in needed when repeatedly enabling and disabling the DAS card feature. "Stick" operations that have been applied through the maintenance interface override similar operations applied through the DAS card interface because the logic function of the source box is altered during the "stick". To apply a "stick" through either interface to a signal that is already stuck through the other interface, the current stick condition must be unstuck prior to applying the new stick operation. This requires extra bookkeeping in the symbol table (FIG. 8, element 525) and special handling in the runtime code.

Process Flow

Figure 6:
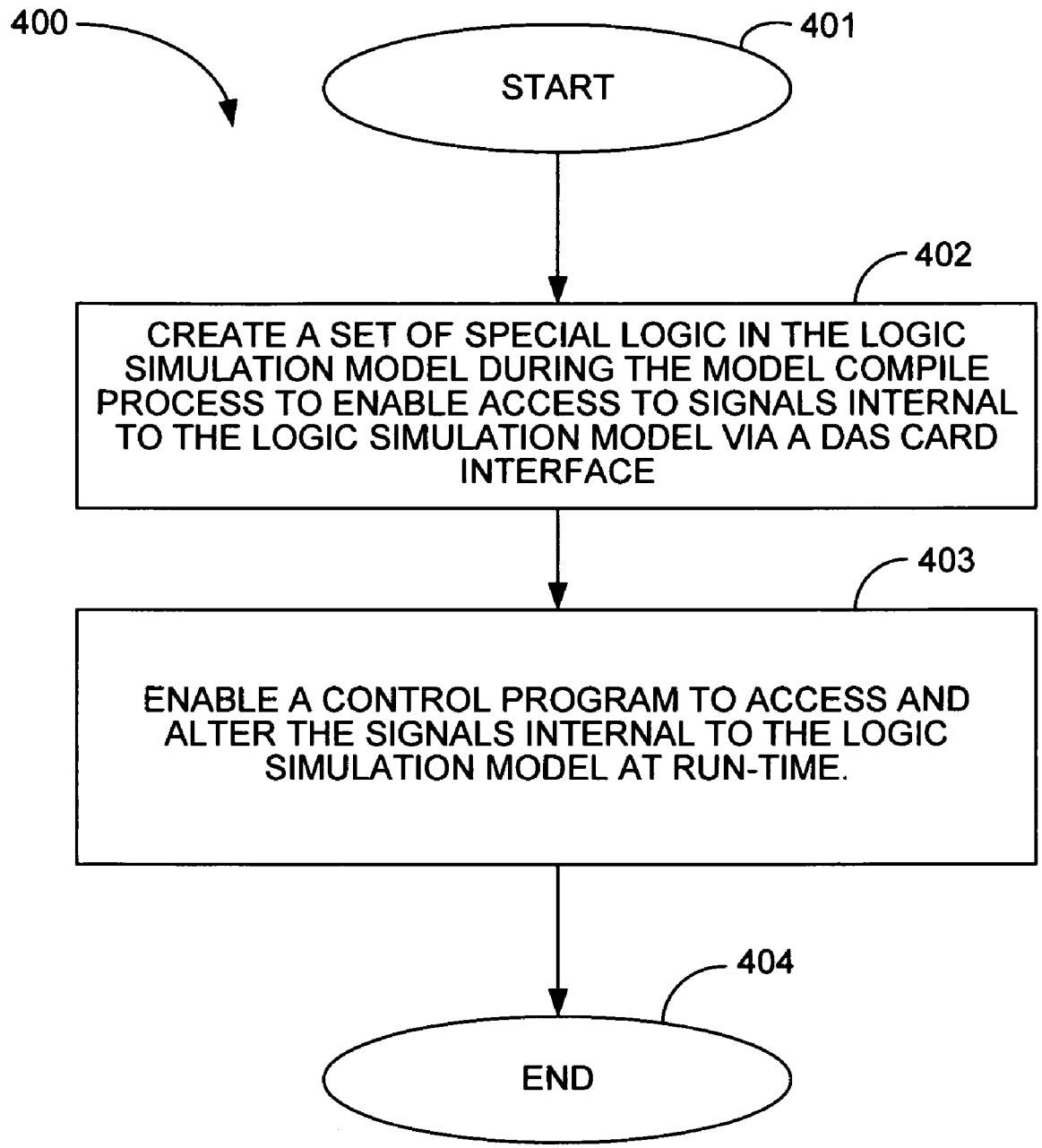
FIG. 6 illustrates a method for providing alternative stimulus to signals internal to a logic simulation model residing on a logic simulation hardware emulator in accordance with the present invention.

FIG. 6 illustrates a method for providing alternative stimulus to signals internal to a logic simulation model residing on a logic simulation hardware emulator, shown generally at 400. At block 401, the method begins. At block 402, the method creates a set of special logic in the logic simulation model 15 during the model compile process to enable access to selected signals internal to the logic simulation model. In order to accomplish this step, the method: 1) inserts a set of special logic 210A, 210B (shown in FIGS. 3B and 4B) into model logic structures within the logic simulation model to provide alternate source and control signals associated with a selected internal signal/group of signals; 2) creates an entry within the symbol table (FIG. 8, element 525) for the selected internal signal/group of signals, the entry having attributes indicating that the selected internal signal/group of signals is accessible via the DAS card interface (e.g., element FIG. 8, element 704D); and 3) creating attributes within the entry for the selected internal signal which contain pointers to the location of the alternate source and control signals associated with the selected internal signal/group of signals.

At block 403, the method enables the control program 20 (residing on host workstation 12) to access and alter the signals internal to the logic simulation model 15 at runtime. In order to accomplish this step, the method: 1) at runtime, connects the control program 20 to the logic simulation model 15 via a DAS interface; 2) references signal attributes stored in the facility symbol table (FIG. 8, element 525) so that the selected signals can be identified as accessible via the DAS interface; and 3) accesses and alters the internal signals of the logic simulation model 15 via the alternate source and control signals connected to the DAS interface and the special logic. The method ends at block 404.

Figure 7:
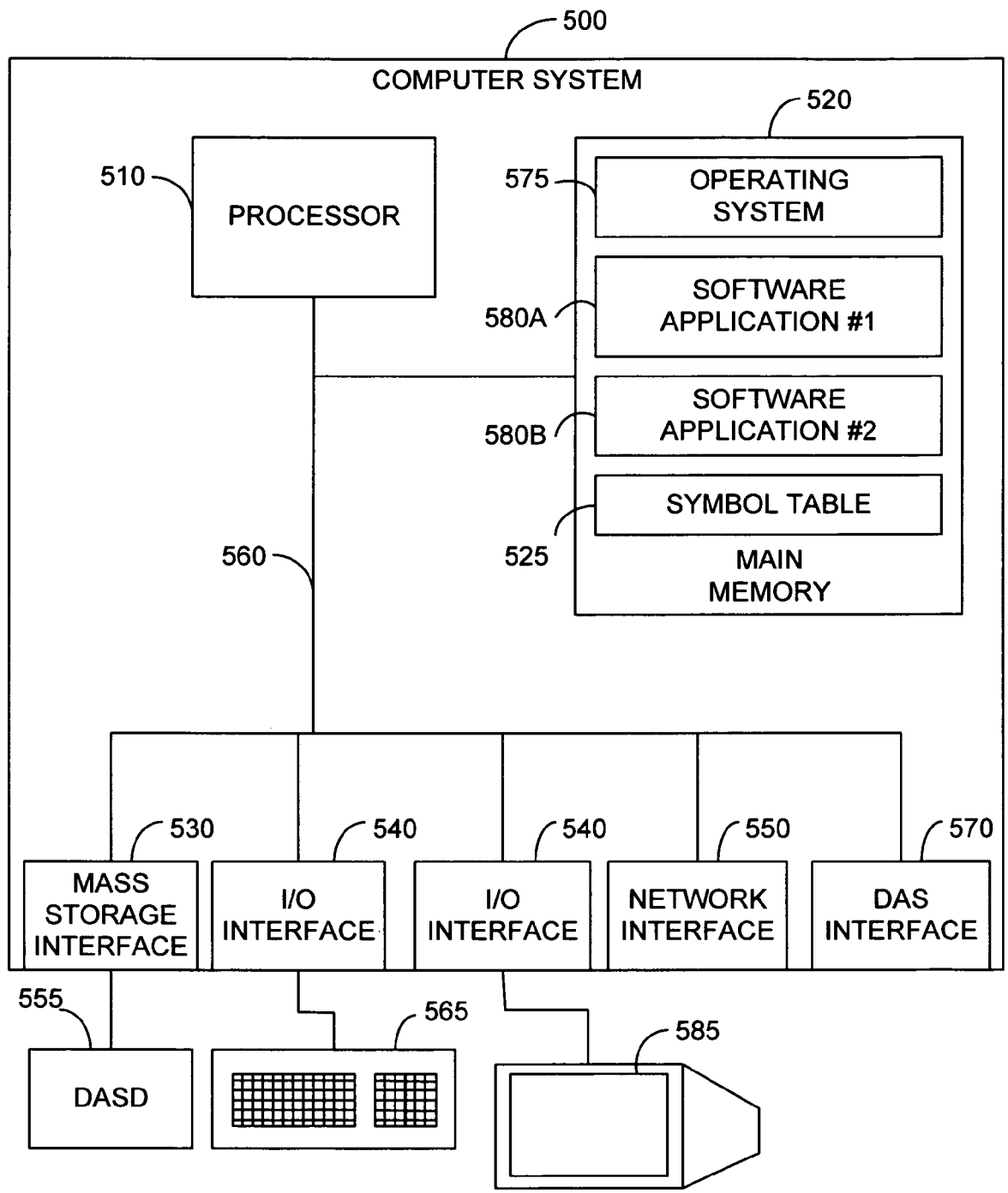
FIG. 7 illustrates a computer system suitable for use with the embodiments illustrated in FIGS. 2-6.

FIG. 7 depicts a computer system 500 embodiment suitable for use as the host workstation (FIG. 2, element 12) of the present invention. The computer system 500 includes a processor 510 connected to a main memory 520, a mass storage interface 530, one or more I/O interfaces 540, a network interface 550, and a DAS interface 570 via a system bus 560. The mass storage interface 530 connects one or more mass storage devices, such as a direct access storage device (DASD) 555, to the system bus 560. The input/output (I/O) interface 540 connects one or more input/output devices, such as a keyboard 565 or computer display 585, to the system bus 560. The network interface 550 connects the computer system 500 to other devices (not shown). The main memory 520 contains one or more programs, such as an operating system 575, software applications 580A, 580B (e.g., logic synthesis software, logic model compilers, or control program 20) and symbol table 525 (more fully described with reference to FIG. 8).

The processor 510 in this embodiment may be any device capable of executing program instructions stored in the main memory 520, and may be constructed from one or more microprocessors and/or integrated circuits. Furthermore, although the computer system 500 is shown to contain only a single processor 510 and a single system bus 560, those skilled in the art will appreciate that the present invention may be practiced using a computer system that has multiple processors 510 and/or multiple buses 560. In addition, the interfaces 530, 540, 550 and 570 may each include their own separate, fully programmed, microprocessors that are used to off-load compute-intensive processing from the main processor 510.

When the computer system 500 starts up, the processor 510 initially executes the program instructions that make up an operating system 575, which is a sophisticated program that manages the resources of computer system 500, including: the processors 510; the main memory 520; the mass storage interface 530; the I/O interfaces 540; the network interface 550; the DAS interface 570; and the system bus 560. Administrators may enter commands for the operating system 575 using appropriate I/O devices, such as the keyboard 565 or mouse (not shown), connected to the I/O interfaces 540.

The computer system 500 may utilize well-known virtual addressing mechanisms that allow its programs to behave as if they have access to a large, single storage entity instead of access to multiple, smaller storage entities such as main memories 520 and the DASD device 555. Therefore, while the operating system 575, symbol table 525 and the software applications 580A, 580B and their associated data are shown to reside in main memory 520, those skilled in the art will recognize that these items are not necessarily all completely contained in main memory 520 at the same time, and may also reside in the virtual memory of other computer systems (not shown) coupled to the computer system.

One suitable computer system 500 is an eServer pSeries® computer running the AIX® multitasking operating system, both of which are produced by International Business Machines Corporation of Armonk, N.Y. However, those skilled in the art will appreciate that the mechanisms and apparatus of the present invention apply equally to any computer system 500 and operating system 575, regardless of whether the computer system 500 is a complicated multi-user computing apparatus; a single-use workstation; a pervasive device, such as a cellular telephone or personal digital assistant (PDA); or an embedded control system.

FIG. 8 illustrates an exemplary embodiment of a symbol table 525 in accordance with the present invention. Symbol table 525 is a software structure which contains information on signals present within the logic model 15. Symbol table 525 contains multiple symbol table entries 702A-702L. Each symbol table entry 702 corresponds to a specific signal or group of signals represented in the logic model 15. The number of symbol table entries varies depending upon the number of signals in the logic model under test. In the illustrated example, an entry 702C is present in the symbol table 525 for the "SIGNAL_C" selected signal previously referenced in FIGS. 3A and 3B. Similarly, an entry 702L is present in the symbol table 525 for the "SIGNAL_L" selected signal previously referenced in FIGS. 4A and 4B.

Each symbol table entry 702 includes one or more attributes 704A-704E which contain information about specific characteristics associated with each signal/group of signals. Attribute 704A provides the name of the signal/group of signals represented within the symbol table. Attributes 704B and 704C are generic representations of other types of attributes that can be associated with a given signal/group of signals. One specific type of attribute 704D indicates whether the specific signal is accessible via the DAS interface. Another specific type of attribute, location pointer 704E, points to the location of signals on the DAS card interface, more specifically, the alternate source and control signals (e.g., Put_Value, Stick_Value, Stick_Op and Put_Op). These location pointers 704E are created during the model build compile process (see FIG. 6, block 402) and are referenced during the run-time process (see FIG. 6, block 403). The location pointers 704E are essentially an offset into the memory buffer that is being bidirectionally transferred between the host system and the logic simulation hardware emulator. The number and type of attributes shown in FIG. 8 are for illustrative purposes only, and may vary in number and content, and still remain within the scope and spirit of the present invention.

Although the present invention has been described in detail with reference to certain examples thereof, it may be also embodied in other specific forms without departing from the essential spirit or attributes thereof. For example, those skilled in the art will appreciate that the present invention is capable of being distributed as a program product in a variety of forms, and applies equally regardless of the particular type of tangible signal bearing media used to actually carry out the distribution. Examples of suitable tangible signal bearing media include, but are not limited to: (i) information permanently stored on non-writable storage media (e.g., read-only memory devices within a computer such as CD-ROM disks readable by a CD-ROM drive); (ii) alterable information stored on writable storage media (e.g., floppy disks, a CD-R disk, a CD-RW disk, or hard-disk drive); or (iii) information conveyed to a computer by a communications medium, such as through a computer or telephone network, and specifically includes information downloaded from the Internet and other networks. Such tangible signal-bearing media, when carrying computer-readable instructions that direct the functions of the present invention, represent embodiments of the present invention.

The invention in its broader aspects is therefore not limited to the specific details, representative apparatus and method, and illustrative examples shown and described. Accordingly, departures may be made from such details without departing from the spirit or scope of applicants' general inventive concept. It is intended that the scope of the present invention be limited not by this detailed description, but rather by the claims appended hereto. Therefore, the invention lies in the claims hereinafter appended.

What is claimed is:

1. A method for providing alternative stimulus to signals internal to a logic simulation model residing on a logic simulation hardware emulator, the method comprising the steps of:

creating a set of special logic in the logic simulation model during the model compile process to enable access to signals internal to the logic simulation model via a Direct Access Stimulus (DAS) card interface; and enabling a control program to access and alter the signals internal to the logic simulation model at runtime.

2. The method of claim 1, wherein the step of creating a set of special logic in the logic simulation model during the model compile process to enable access to signals internal to the logic simulation model via a DAS card interface comprises the steps of:

inserting the set of special logic into model logic structures within the logic simulation model to provide alternate source and control signals associated with a selected internal signal;

creating an entry within a symbol table for the selected internal signal, the entry having attributes indicating that the selected internal signal is accessible via the DAS card interface; and creating attributes within the entry for the selected internal signal which contain pointers to the location of the alternate source and control signals associated with the selected internal signal.

3. The method of claim 2, wherein the step of enabling a control program to access and alter the signals internal to the logic simulation model at runtime comprises the steps of:

providing a feature to allow the control program to enable or disable access to signals via the DAS interface;

if access to the DAS interface is enabled, examining the attributes within the symbol table entry for the selected internal signal to determine if the selected internal signal is accessible via the DAS interface; and if the selected internal signal is accessible via the DAS interface, determining the location pointer attributes for the associated alternate source and control signals to enable the control program to access the selected internal signal via the associated alternate source and control signals.

4. The method of claim 2, wherein the special logic is inserted into the model logic structure when the internal signal is sourced by a combinational logic primitive function.

5. The method of claim 2, wherein the special logic is inserted into the model logic structure when the internal signal is sourced by a latch function.

6. The method of claim 2, wherein the step of inserting the set of special logic into model logic structures within the logic simulation model to provide alternate source and control signals associated with a selected internal signal further includes the step of:

multiplexing the selected internal signal with a selector function which provides an alternate source for the signal.

7. The method of claim 6, wherein the alternate source is a stick operation, the stick operation forcing the internal signal to a continuous, designated logic state until overridden.

8. The method of claim 6, wherein the alternate source is a put operation, the put operation forcing the internal signal to a designated logic state for a single clock cycle.

9. A logic simulation hardware emulator, comprising:

a host workstation having a control program;

an emulation system comprising a logic model having a plurality of signals;

a set of special logic coupled to the logic model for providing alternate sources to a set selected signals chosen from the plurality of signals;

a Direct Access Stimulus (DAS) card interface coupling the control program to the set of special logic;

wherein the control program provides alternative stimulus to one or more signals internal to the logic model while the emulation system is actively cycling via the set of special logic.

10. The logic simulation hardware emulator of claim 9, wherein the special logic includes a multiplexer for multiplexing the current state of the internal signal with an alternate source for the signal.

11. The logic simulation hardware emulator of claim 10, wherein the alternate source is a stick operation, the stick operation forcing the internal signal to a designated logic state until overridden.

12. The logic simulation hardware emulator of claim 10, wherein the alternate source is a put operation, the put operation forcing the internal signal to a designated logic state for a single clock cycle.

13. A computer-readable program stored on a tangible storage readable-medium, the computer-readable program providing a method for providing alternative stimulus to signals internal to a logic simulation model residing on a logic simulation hardware emulator, the computer-readable program comprising the steps of:

creating a set of special logic in the logic simulation model during the model compile process to enable access to signals internal to the logic simulation model via a Direct Access Stimulus (DAS) card interface; and enabling a control program to access and alter the signals internal to the logic simulation model at runtime.

14. The computer-readable program of claim 13, wherein the step of creating a set of special logic in the logic simulation model during the model compile process to enable access to signals internal to the logic simulation model via a DAS card interface comprises the steps of:

inserting the set of special logic into model logic structures within the logic simulation model to provide alternate source and control signals associated with a selected internal signal;

creating an entry within a symbol table for the selected internal signal, the entry having attributes indicating that the selected internal signal is accessible via the DAS card interface; and creating attributes within the entry for the selected internal signal which contain pointers to the location of the alternate source and control signals associated with the selected internal signal.

15. The computer-readable program of claim 14, wherein the step of enabling a control program to access and alter the signals internal to the logic simulation model at runtime comprises the steps of:

providing a feature to allow the control program to enable or disable access to signals via the DAS card interface;

if access to the DAS interface is enabled, examining the attributes within the symbol table entry for the selected internal signal to determine if the selected internal signal is accessible via the DAS interface; and if the selected internal signal is accessible via the DAS interface, determining the location pointer attributes for the associated alternate source and control signals to enable the control program to access the selected internal signal via the associated alternate source and control signals.

16. The tangible storage readable-medium of claim 14, wherein the special logic is inserted into the model logic structure when the internal signal is sourced by a combinational logic primitive function.

17. The tangible storage readable-medium of claim 14, wherein the special logic is inserted into the model logic structure when the internal signal is sourced by a latch function.

18. The tangible storage readable-medium of claim 14, wherein the step of inserting the set of special logic into model logic structures within the logic simulation model to provide an alternate source for the internal signals further includes the step of:

multiplexing the internal signal with a selector function which provides an alternate source for the signal.

19. The tangible storage readable-medium of claim 18, wherein the alternate source is a stick operation, the stick operation forcing the internal signal to a designated logic state until overridden.

20. The tangible storage readable-medium of claim 18, wherein the alternate source is a put operation, the put operation forcing the internal signal to a designated logic state for a single clock cycle.

* * * * *